(12) United States Patent
Takamura et al.

(10) Patent No.: US 8,647,747 B2
(45) Date of Patent: Feb. 11, 2014

(54) HYBRID SILICON WAFER AND METHOD OF PRODUCING THE SAME

(75) Inventors: Hiroshi Takamura, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 175 days.

(21) Appl. No.: 12/832,150

(22) Filed: Jul. 8, 2010

(65) Prior Publication Data
US 2012/0009374 A1 Jan. 12, 2012

(51) Int. Cl.
B32B 3/02 (2006.01)
B32B 9/04 (2006.01)
B32B 13/04 (2006.01)
C01B 33/02 (2006.01)
B29D 7/00 (2006.01)

(52) U.S. Cl.
USPC ........... 428/446; 423/348; 428/64.1; 264/158

(58) Field of Classification Search
USPC .................................. 423/348; 428/64.1, 446
See application file for complete search history.

(56) References Cited

U.S. PATENT DOCUMENTS

| | | | |
|---|---|---|---|
| 4,921,026 A | 5/1990 | Flagella et al. | |
| 5,382,549 A * | 1/1995 | Ohshima et al. | 438/677 |
| 6,245,161 B1 | 6/2001 | Henley et al. | |
| 7,259,077 B2 * | 8/2007 | Degani et al. | 438/381 |
| 7,635,868 B2 | 12/2009 | Kojima et al. | |
| 2008/0122042 A1 | 5/2008 | Goldstein et al. | |
| 2009/0263626 A1 | 10/2009 | Fujiwara | |
| 2010/0016144 A1 | 1/2010 | Suzuki et al. | |
| 2010/0187661 A1 | 7/2010 | Suzuki et al. | |
| 2010/0330325 A1 | 12/2010 | Suzuki et al. | |
| 2011/0123795 A1 | 5/2011 | Satoh et al. | |
| 2012/0009373 A1 | 1/2012 | Takamura et al. | |

FOREIGN PATENT DOCUMENTS

| | | | | |
|---|---|---|---|---|
| JP | 05-229812 A | | 9/1999 | |
| JP | 2004-289065 A | | 10/2004 | |
| JP | 2005-132671 A | | 5/2005 | |
| JP | WO2009/011233 | * | 1/2009 | ............. C04B 35/00 |
| WO | WO/2009/014961 | * | 1/2009 | ............. C30B 11/00 |
| WO | 2010/004863 A1 | | 1/2010 | |

OTHER PUBLICATIONS

Nicky Chau-Chun et al., "Modeling and Optimization of Monolithic Polycrystalline Silicon Resistors", IEEE Transactions on Electron Devices, vol. ED-28, No. 7, pp. 818-830, 1981 (month unknown).
Kinzoku Binran (Metal Handbook), Revised Version 6, published on May 30, 2000, edited by the Japan Institute of Metals, published by Maruzen Co., Ltd. pp. 904, 905 and 931-933.

* cited by examiner

Primary Examiner — Jonathan Langman
(74) Attorney, Agent, or Firm — Howson & Howson LLP

(57) ABSTRACT

Provided is a hybrid silicon wafer in which molten state polycrystalline silicon and solid state single-crystal silicon are mutually integrated, comprising fine crystals having an average crystal grain size of 8 mm or less at a polycrystalline portion within 10 mm from a boundary with a single-crystal portion. Additionally provided is a method of manufacturing a hybrid silicon wafer, wherein a columnar single-crystal silicon ingot is sent in a mold in advance, molten silicon is cast around and integrated with the single-crystal ingot to prepare an ingot complex of single-crystal silicon and polycrystalline silicon, and a wafer shape is cut out therefrom. The provided hybrid silicon wafer comprises the functions of both a polycrystalline silicon wafer and a single-crystal wafer.

12 Claims, 1 Drawing Sheet

Fig.2 Comparison of structure

HYBRID SILICON WAFER AND METHOD OF PRODUCING THE SAME

BACKGROUND OF THE INVENTION

1. Field of the Invention

The present invention relates to a hybrid silicon wafer comprising the functions of both a polycrystalline silicon wafer and a single-crystal wafer, and to the method of manufacturing such a hybrid silicon wafer.

2. Description of the Related Art

In the silicon semiconductor manufacturing process, a wafer prepared based on single-crystal growth is primarily used. This single-crystal silicon wafer has increased in size with the times, and it is anticipated that the inner diameter will become ϕ400 mm or larger in the near future. In addition, a so-called mechanical wafer for testing is now required in order to establish the apparatus and peripheral technology necessary for the semiconductor manufacturing process.

Generally speaking, since this kind of mechanical wafer is subject to fairly high precision testing, it needs to possess characteristics that are similar to the mechanical physicality of single-crystal silicon. Thus, conventionally, although it was to be used for testing, in reality the single-crystal silicon wafer was being used as is. However, since a single-crystal silicon wafer having an inner diameter of ϕ400 mm or larger is extremely expensive, an inexpensive wafer having characteristics that are similar to single-crystal silicon is in demand.

Meanwhile, as a component of such semiconductor manufacturing equipment, a proposal has also been made for using a sputtering target formed from a rectangular or disk-shaped silicon plate. The sputtering method is being used as a means for forming thin films, and there are several sputtering methods including the bipolar DC sputtering method, radio frequency sputtering method, magnetron sputtering method and the like, and thin films of various electronic parts are being formed using the sputtering characteristics unique to the respective methods.

This sputtering method is a method that faces a substrate as the anode and a target as the cathode, and generates an electrical field by applying a high voltage between the foregoing substrate and target under an inert gas atmosphere. Here, the ionized electrons and inert gas collide to form a plasma, the cations in the plasma collide with the target surface to hammer out the target constituent atoms, and the discharged atoms adhere to the opposite substrate surface so as to form a film.

A polycrystalline silicon sintered compact is proposed for this kind of sputtering target, and this sintered compact target is demanded of considerable thickness and of being large-size rectangular or disk-shaped in order to improve the deposition efficiency. Moreover, a proposal has also been made for using this polycrystalline silicon sintered compact as a board for retaining the single-crystal silicon wafer. Nevertheless, polycrystalline silicon entails significant problems in that the sinterability is inferior, the obtained products have low density, and the mechanical strength is low.

In light of the above, in order to improve the characteristics of the foregoing silicon sintered compact, proposed is a silicon sintered compact formed by compression-molding and sintering silicon powder obtained by being heated and deoxidized under reduced pressure and within a temperature range that is 1200° C. or higher and less than the melting point of silicon, and setting the crystal grain size of the sintered compact to be 100 μm or less (for instance, refer to Japanese Patent No. 3342898).

If the thickness of the silicon sintered compact manufactured as described above is thin; for instance, 5 mm or less, the density will relatively increase and the strength will also increase, however, if the thickness becomes thicker, the density will continue to be a low density (less than 99%), and the mechanical strength will also deteriorate. Thus, it is a problem that manufacturing a large-size rectangular or disk-shaped silicon sintered compact is not possible.

In light of the foregoing circumstances, the present applicant previously proposed a silicon sintered compact and its production method in which the average crystal grain size is 50 μm or less and the relative density is 99% or more (refer to Japanese Patent No. 3819863).

Although this silicon sintered compact possesses numerous advantages including high density and high mechanical strength, the further improvement of these characteristics is being demanded, and the applicant filed a patent application relating to technology that improved the foregoing points.

Since a wafer using the foregoing silicon sintered compact has similar mechanical properties as single-crystal silicon, it can be used as a dummy wafer for the transport system of semiconductor manufacturing equipment or the development of robotics. In addition, the application of an SOI wafer as a base substrate is also being considered.

Nevertheless, these are all polycrystalline silicons made from a silicon sintered compact, and although there are numerous points that are similar to the physical properties of a single crystal, they do not possess the function as the single-crystal itself, and there is a fundamental problem in that they cannot be used for process testing such as deposition experiments.

Moreover, there is also a proposal of manufacturing a high quality polycrystalline silicon in substitute for single-crystal silicon (refer to Japanese Patent Published Unexamined Application No. 2005-132671). Nevertheless, polycrystalline silicon has a drawback in that, no matter what kind of devisal is made, its characteristics will be inferior to single-crystal silicon. As a means for overcoming this drawback, M. Goldstein of Intel and others proposed a wafer in which single-crystal silicon is embedded in polycrystalline silicon (refer to US Patent Publication No. 2008/0122042).

Moreover, the present applicant previously filed an application for an invention which uses silicon prepared with the sintering method at the polycrystalline portion of the wafer in which single-crystal silicon is embedded in the foregoing polycrystalline silicon. However, the sintered silicon contains large amounts of gas components such as oxygen and carbon, and since precipitates of $SiO_2$ and SiC exist at the crystal grain boundary, there is a problem in that unevenness will occur during the polishing due to the difference in the polishing rate compared to the single-crystal portion (refer to International Publication No. WO2010-004863).

In light of the above, the present applicant proposed manufacturing a hybrid silicon wafer by hollowing a part of a polycrystalline silicon prepared in advance based on the unidirectional solidification/melting method, inserting a single-crystal silicon ingot into the hollowed portion, performing thermal diffusion bonding thereto in order to prepare a complex of a polycrystalline silicon and a single-crystal silicon ingot, and slicing the complex to manufacture a hybrid silicon wafer (refer to Japanese Patent Application No. 2009-255016).

Although this method is less costly than a wafer in which the entire surface is formed of a single crystal, it is necessary to strictly control the tolerance of the hollowing process of the polycrystalline and the edge processing of the single crystal to be embedded, and there is a problem in that this led to the increase in production costs.

SUMMARY OF THE INVENTION

As described above, the shape of a single-crystal wafer that is used in the LSI process is becoming a greater diameter with the times, and a single-crystal wafer having a diameter of 400 mm or more is becoming standard. Nevertheless, a single-crystal wafer having a diameter of 400 mm or more is extremely expensive, and consequently its dummy wafer is also expensive, and costs of the LSI process will thereby increase. Moreover, with a single-crystal silicon wafer of a large diameter; for instance, a diameter of 400 mm or more, there is concern that the cracks of the single-crystal cleavage surface will increase and the production yield will deteriorate compared to a conventional 300 mm wafer.

Thus, the present invention inexpensively provides a so-called hybrid wafer combining polycrystalline silicon and single-crystal silicon by using a general-purpose 300 mm single-crystal and which can be applied to a dummy wafer of 400 mm or more, as well as improves the production yield by improving the strength of the dummy wafer. Consequently, the present invention is able to provide a hybrid silicon wafer comprising the functions of both a polycrystalline silicon wafer and a single-crystal silicon wafer.

Although a sintered silicon may be used at the polycrystalline silicon portion of the hybrid wafer, since there is a large amount of gas components such as C and O compared to a melted Si ingot and SiC and $SiO_2$ of high hardness precipitate at the crystal grain boundary, the polishing rate is slow in the mirror polishing process compared to the single-crystal silicon portion, and there is a problem in that unevenness will occur in the thickness of the single-crystal silicon portion and the polycrystalline silicon portion. Thus, an object of this invention is to provide a hybrid silicon wafer capable of overcoming the foregoing problems, and provide it more inexpensively.

In order to achieve the foregoing object, the present inventors discovered that a hybrid silicon wafer comprising the functions of both a polycrystalline silicon wafer and a single-crystal silicon wafer can be obtained by integrating polycrystalline silicon and single-crystal silicon, in which their mechanical strength has been improved, in a state where one is molten and another is an ingot (solid).

Based on the foregoing discovery, the present invention provides a "hybrid silicon wafer" according to 1) to 4) below.
1) A hybrid silicon wafer in which molten state polycrystalline silicon and solid state single-crystal silicon are mutually integrated, comprising fine crystals having an average crystal grain size of 8 mm or less at a polycrystalline portion within 10 mm from a boundary with a single-crystal portion.
2) The hybrid silicon wafer according to 1) above, wherein the relative intensity based on X-ray diffraction of a (400) orientation of the polycrystalline portion within 10 mm from the boundary with the single-crystal portion is 5 or more when the intensity of a (511) orientation is 100.
3) The hybrid silicon wafer according to 1) or 2), wherein a central portion or a decentered portion has a single-crystal crystal structure.
4) The hybrid silicon wafer according to any one of 1) to 3) above, wherein the wafer is disk-shaped, and the overall diameter of the wafer is 400 mm or more.

The present invention additionally provides a "method of manufacturing a hybrid silicon wafer" according to 5) to 8) below.

5) A method of manufacturing a hybrid silicon wafer, wherein a columnar single-crystal silicon ingot is set in a mold in advance, molten silicon is cast around and integrated with the single-crystal ingot to prepare an ingot complex of single-crystal silicon and polycrystalline silicon, and a wafer shape is cut out therefrom.
6) The method of manufacturing a hybrid silicon wafer according to 5) above, wherein the wafer is an ingot complex of single-crystal silicon and polycrystalline silicon comprising fine crystals having an average crystal grain size of 8 mm or less at a polycrystalline portion within 10 mm from a boundary with a single-crystal portion.
7) The method of manufacturing a hybrid silicon wafer according to 5) or 6) above, wherein the mold is preheated to 800 to 1300° C.
8) The method of manufacturing a hybrid silicon wafer according to any one of 5) to 7) above, wherein a crucible for melting polycrystalline silicon is a crucible comprised primarily of $SiO_2$, a carbon sleeve is disposed around the crucible, temperature of carbon is raised based on high frequency induction heating, and silicon is heated and melted indirectly based on the heat transfer thereof.

As a result of the above, it is possible to provide a hybrid silicon wafer comprising the functions of both a polycrystalline silicon wafer and a single-crystal wafer. Thus, the present invention yields a significant effect of simultaneously possessing the characteristics and function as a single-crystal wafer. Moreover, the bonding stability of the boundary of the polycrystalline portion and the single-crystal portion of the hybrid silicon wafer can be further improved by integrating the hybrid silicon wafer from a molten state.

The hybrid silicon wafer according to the present invention comprises characteristics that are similar to the mechanical properties of single-crystal silicon that is used as a mechanical wafer, and possesses the capability of monitoring the semiconductor manufacture process at the single-crystal portion. In other words, the present invention can be used as a wafer for monitoring particles and monitoring lithography in addition to being used for the transport system of semiconductor manufacturing equipment or the development of robotics In addition, since polycrystalline silicon can be formed by melting silicon around a single-crystal ingot, a large ingot can be prepared easily. Moreover, since the boundary faces are mutually integrated, a hybrid silicon wafer can be manufactured by slicing the prepared complex.

As described above, the hybrid silicon wafer comprising the functions of both a polycrystalline silicon wafer and a single-crystal wafer is able to considerably improve the production yield and reduce production costs compared to an independent single-crystal wafer of the same size. In addition, the present invention yields a significant effect of being able to prepare an inexpensive dummy silicon wafer of 400 mm or more by using polycrystalline silicon blocks for commercialized solar batteries and waste materials, and a 300 mm single-crystal silicon ingot.

Furthermore, a dummy silicon wafer prepared by using a polycrystalline silicon ingot having a purity of 6N or higher is characterized in that it will not contaminate the process unit or other components even when it is introduced into the process unit. Moreover, since the polycrystalline silicon is melted and bonded around the single-crystal with a cleavage surface, a significant effect is yielded in that the strength of the wafer can be increased, and the deterioration in the production yield caused by cracks in the cleavage of the wafer can be prevented.

BRIEF DESCRIPTION OF THE DRAWINGS

FIG. 2 is an explanatory diagram showing the condition of the boundary face of the single-crystal wafer and the polycrystalline wafer, wherein FIG. 2A is an explanatory diagram showing the condition of the hybrid wafer of the present invention and FIG. 2B is an explanatory diagram showing the condition of the hybrid wafer subject to thermal diffusion bonding.

DESCRIPTION OF THE PREFERRED EMBODIMENTS

The hybrid silicon wafer of the present invention is a wafer in which molten state polycrystalline silicon and solid state single-crystal silicon are mutually integrated. This hybrid silicon wafer is unique in that it comprises fine crystals having an average crystal grain size of 8 mm or less at a polycrystalline portion within 10 mm from a boundary with a single-crystal portion.

Figure 1:
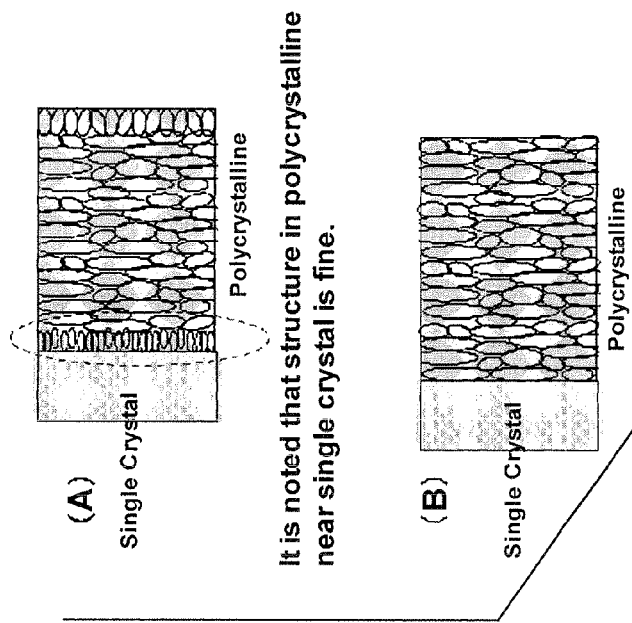
FIG. 1 is a schematic explanatory diagram showing an example of the manufacturing process of melting silicon as the polycrystal, and casting this around the single-crystal ingot to obtain an ingot complex.
Figure 1:
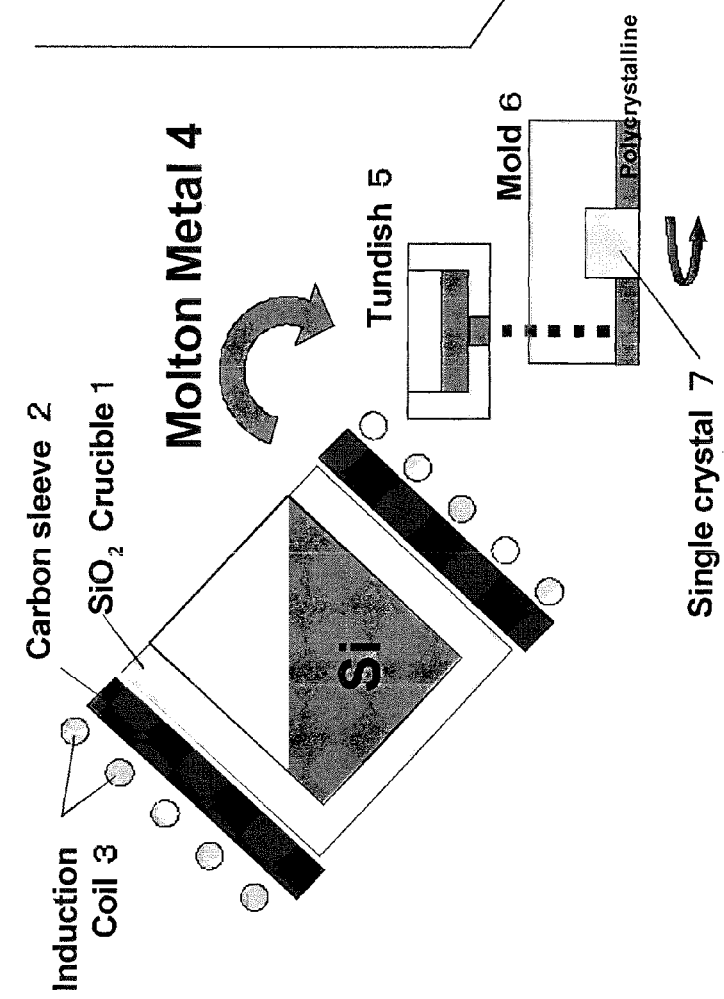

Upon manufacturing this hybrid silicon wafer, as shown in FIG. 1, a columnar single-crystal silicon ingot is set in a mold in advance, and molten silicon is cast around and integrated with the single-crystal ingot to prepare an ingot complex of single-crystal silicon and polycrystalline silicon. Subsequently, this ingot is cut out (sliced) into a wafer shape to obtain the hybrid silicon wafer.

Upon melting the raw material to become the polycrystalline silicon, a crucible 1 comprised primarily of $SiO_2$ as shown in FIG. 1 is used, and a silicon raw material is placed therein and melted. The crucible 1 is provided with a carbon sleeve 2 around its periphery as shown in FIG. 1, raises the temperature of the carbon sleeve 2 based on high frequency induction heating (coil 3), and indirectly heats and melts the silicon based on the heat transfer thereof.

The silicon is melted by being heated to 1450 to 1550° C. The molten metal 4 as the molten silicon is once retained in a tundish 5, and this is poured into the mold 6. Desirably, the mold is preheated to 800 to 1300° C. to alleviate the thermal shock. In addition, the mold 6 should be rotated to uniformly distribute the molten metal.

The single-crystal silicon ingot 7 is set in the mold in advance while managing the plane orientation. Desirably, this single-crystal silicon ingot 7 is fixed so that it will not float or move when the silicon molten metal is poured. In normal circumstances, a method of pressing it down with a material having a high melting point, having high specific gravity, and which does not react with Si is adopted.

When integrating the single-crystal and polycrystalline silicon to form an ingot, cutting this out (slicing this) into a wafer shape and observing the structure, fine crystals having an average crystal grain size of 8 mm or less are observed at a polycrystalline portion within 10 mm from a boundary with a single-crystal portion.

This condition is shown in FIG. 2A. Moreover, if the amount of the outer periphery of the ingot that is ground is small and the outer periphery of the wafer remains in the vicinity of the inner wall of the mold, fine crystals having an average crystal grain size of 8 mm or less are similarly observed at the edge of the wafer. This is a significant feature of the hybrid silicon wafer of the present invention. This is considered to be a result of the free crystals existing in the silicon molten metal upon casting the polycrystalline silicon floating and adhering to the low-temperature single silicon crystal and the inner wall of the mold, and becoming the origin of the start of solidification.

If solid single-crystal silicon and solid polycrystalline silicon are simply heated and bonded, clear fine crystals of the hybrid silicon wafer of the present invention cannot be observed as shown in FIG. 2B.

After solidification, the polycrystalline silicon is solidified around the single-crystal silicon, and an integrated columnar ingot is obtained. By slicing this integrated columnar complex, it is possible to obtain an integrated discoid hybrid silicon wafer in which its periphery is polycrystalline and its inside is single-crystal. This slicing is performed as with normal wafers; that is, peripheral grinding, multi-wire saw, edge and notch processing, grinding and polishing, cleaning and the like are performed to obtain a hybrid wafer.

The hybrid wafer obtained as described above is characterized in that the relative intensity based on X-ray diffraction of a (400) orientation of the polycrystalline portion within 10 mm from the boundary with the single-crystal portion is 5 or more when the intensity of a (511) orientation is 100.

The hybrid silicon wafer obtained as described above is disk-shaped, and the overall diameter of the wafer can be made to be 400 mm or more. Moreover, it is also possible to form the wafer in a rectangular shape or other shapes depending on how the wafer is cut out from the ingot.

In the foregoing explanation, a case was described where a single-crystal ingot is disposed at the central portion of the mold to manufacture a concentric hybrid silicon wafer having a single-crystal wafer at its central portion and a polycrystalline wafer at the periphery thereof. However, it is also possible to intentionally decenter the single-crystal portion and dispose it at a position which enables the monitoring from the center to the edge of the wafer. The present invention covers all of the above.

Although the foregoing explanation explained a case of combining one single-crystal and one polycrystal to obtain the discoid hybrid silicon wafer, needless to say that a combination of one single-crystal and a plurality of polycrystals or a combination of mutual polycrystals may also be used. For example, in the case of the former, after preparing in advance an ingot based on the combination of one single-crystal and one polycrystalline, the ingot is similarly disposed in the mold, and a silicon raw material having a different melting point (low melting point) is melted and poured around the ingot to prepare an integrated columnar ingot made of one single-crystal and a plurality of polycrystals.

Moreover, by slicing this integrated columnar complex, it is possible to obtain an integrated discoid hybrid silicon wafer being single-crystal on its inside and a plurality of polycrystals with different properties at the periphery thereof.

Although the foregoing explanation was based on the premise that it is essential to prepare a single-crystal silicon ingot in advance, it should be easy to understand that a discoid hybrid silicon wafer can also be manufactured only from polycrystalline silicon as a matter of course. The present invention covers all of the above.

It is thereby possible to obtain a hybrid silicon wafer made of two or more types of silicons with different crystal structures or components or a wafer comprised primarily of silicon by mutually integrating one as a molten state and another as a solid state.

The hybrid silicon wafer that is manufactured using a crucible will be disk-shaped, but it may also be formed in a rectangular shape or other shapes depending on how the wafer is cut out. As the discoid wafer, a wafer having an overall diameter of 400 mm or more can be obtained.

Here, the diameter of the ingot complex needs to be 400 mm or more, but there is no limitation to this shape, and the shape may be arbitrarily set.

Desirably, the polycrystalline silicon portion of the hybrid silicon wafer has a purity of 6N or higher excluding dopants and gas components, the total amount of metal impurities is 1 wtppm or less, and the respective amounts of Cu, Fe, Ni, and Al in the metal impurities are 0.1 wtppm or less. Moreover, desirably, C and O as the gas components of the polycrystalline silicon portion are respectively 100 wtppm or less.

A dummy silicon wafer manufactured as described above is characterized in that it will not contaminate the process unit or other components even when it is introduced into the process unit. Consequently, it is possible to increase the utility value of a disk-shaped wafer having an overall diameter or 400 mm or more.

As the polycrystalline silicon wafer to become the support base of the single-crystal silicon wafer, a large wafer can be prepared. Meanwhile, with single-crystal silicon, large size silicon in which its inner diameter exceeds 400 mm is extremely expensive. Thus, a silicon wafer having an inner diameter of 400 mm or more can be easily prepared with a polycrystalline silicon wafer.

There is no particular limitation to the size of the single-crystal silicon to be used as a part of the hybrid silicon wafer. However, if the longest diameter of the single-crystal wafer is 50% or more of the diameter of the overall wafer, there is an advantage in that the hybrid silicon wafer can be effectively used in the testing that uses the characteristics of a single-crystal wafer.

The foregoing hybrid silicon wafer is able to effectively utilize the function as a single-crystal wafer or as a polycrystalline wafer. Not only can it be used as a mechanical wafer (or a dummy wafer), it can also be used as a test wafer of equipment testing such as deposition experiments on a single-crystal. Namely, this wafer can be used for monitoring particles and monitoring lithography or the like.

Accordingly, the "hybrid silicon wafer" of the present invention is available for multipurpose utilization, and a silicon wafer comprising the foregoing characteristics did not conventionally exist.

EXAMPLES

The present invention is now explained in detail with reference to the Examples. These Examples are merely for facilitating the understanding of this invention, and the present invention shall in no way be limited thereby. In other words, various modifications and other embodiments based on the technical spirit claimed in the claims shall be covered by the present invention as a matter of course.

Example 1

Amorphous silicon (having a purity of roughly 7N excluding dopants and gas components) having an average size of 30 mm to become the raw material of the polycrystalline silicon was placed in a quartz crucible surrounded with carbon, and the temperature was raised to 1500° C. in a vacuum based on high frequency induction heating to melt the silicon.

Meanwhile, as shown in FIG. 1, a single-crystal ingot 7 having a diameter of 200 mm, height of 220 mm and purity of 11N was set in a mold 6 having an inner diameter of 360 mm. The single-crystal ingot 7 was fixed upon setting its plane orientation to a prescribed position and placing a high melting point metal with greater specific gravity than Si thereon so as not move when molten metal is poured by. The overall mold was preheated to 1200° C. in order to reduce the thermal shock.

Subsequently, the silicon as the molten metal 4 in the crucible was cast up to a height of 100 mm via the tundish 5 while controlling the pour spout, and the single-crystal ingot and the cast polycrystalline ingot were thereby integrated. Upon observing the structure of the prepared hybrid ingot, the vicinity of the boundary face of the inner wall of the crucible and the single-crystal had a fine structure since it will be the origin of the start of solidification.

The hybrid ingot was sliced as with normal wafers; that is, peripheral grinding, multi-wire saw, edge and notch processing, grinding and polishing, cleaning and the like are performed to obtain a hybrid wafer.

Upon observing the structure of the hybrid wafer, it had a fine structure having an average crystal grain size of 8 mm or less at a polycrystalline portion within 10 mm from a boundary with a single-crystal portion. In addition, the relative intensity based on X-ray diffraction of a (400) orientation of the polycrystalline portion within 10 mm from the boundary with the single-crystal portion was 8 when the intensity of a (511) orientation is 100. Meanwhile, the relative intensity based on X-ray diffraction of a (400) orientation of the polycrystalline portion distanced 50 mm or more from the single-crystal portion and the wafer edge was 1 when the intensity of a (511) orientation is 100.

With the structure of the wafer edge, since the diameter decreased from 360 mm to 300 mm, the characteristics that were seen with an ingot were alleviated, and the average crystal grain size was roughly 12 mm.

Example 2

Single-crystal silicon waste material having a diameter of roughly 10 mm and purity of 6N to become the raw material of the polycrystalline silicon was placed in a quartz crucible surrounded with carbon, and the temperature was raised to 1520° C. in a vacuum based on high frequency induction heating to melt the silicon.

Meanwhile, as shown in FIG. 1, a single-crystal ingot 7 having a diameter of 300 mm and height of 150 mm was set in a mold 6 having an inner diameter of 500 mm. The single-crystal ingot 7 was fixed upon setting its plane orientation to a prescribed position and so that it will not move when molten metal is poured by placing a high melting point metal with greater specific gravity than Si thereon.

The overall mold was preheated to 1250° C. in order to reduce the thermal shock. Subsequently, the silicon 4 as the molten metal in the crucible 1 was cast up to a height of 80 mm via the tundish 5 while controlling the pour spout, and the single-crystal ingot 7 and the cast polycrystalline ingot were thereby integrated. The mold 6 was rotated during the casting to realize uniform casting.

Upon observing the structure of the prepared hybrid ingot, as shown in FIG. 2A, the vicinity of the boundary face of the inner wall of the crucible and the single-crystal had a fine structure since it will be the origin of the start of solidification.

The hybrid ingot was sliced as with normal wafers; that is, peripheral grinding, multi-wire saw, edge and notch processing, grinding and polishing, cleaning and the like are performed to obtain a hybrid wafer having a diameter of 450 mm. Upon observing the structure of the hybrid wafer, it had a fine structure having an average crystal grain size of 8 mm or less at a polycrystalline portion within 10 mm from a boundary with a single-crystal portion.

In addition, the relative intensity based on X-ray diffraction of a (400) orientation was 12 when the intensity of a (511) orientation is 100. Meanwhile, the relative intensity based on X-ray diffraction of a (400) orientation of the polycrystalline portion distanced 50 mm or more from the single-crystal portion and the wafer edge was 2 when the intensity of a (511) orientation is 100. By way of reference, with the structure of the wafer edge, since the diameter decreased from 500 mm to 450 mm, the characteristics that were seen with an ingot were alleviated.

INDUSTRIAL APPLICABILITY

As a result of the above, the present invention yields a significant effect of being able to provide a hybrid silicon wafer comprising the functions of both a single-crystal silicon wafer and a polycrystalline silicon wafer, or the functions of different types of polycrystalline silicon wafers.

The polycrystalline silicon wafer to become the support base of the hybrid silicon wafer can be enlarged easily. The polycrystalline silicon wafer of the hybrid silicon wafer according to the present invention comprises characteristics that are similar to the mechanical properties of single-crystal silicon that is used as a mechanical wafer, and possesses the capability of monitoring the semiconductor manufacture process at the single-crystal portion.

The hybrid silicon wafer comprising the functions of both a polycrystalline silicon wafer and a single-crystal wafer is able to considerably improve the production yield and reduce production costs compared to an independent single-crystal wafer, and is therefore useful as a test wafer of a deposition system or the like.

What is claimed is:

1. A hybrid silicon wafer obtained by integrating a single crystalline silicon and molten state silicon placed around the single crystalline silicon and solidifying the molten state silicon to form a body of polycrystalline silicon around the single-crystalline silicon, comprising:
    a structure in which a plate-shaped single-crystal silicon portion has an outer peripheral edge and in which a polycrystalline silicon portion having a cast structure extends coplanar with the single-crystal silicon portion and laterally from the outer peripheral edge of the single-crystal silicon portion such that the polycrystalline silicon portion forms an outer peripheral edge of the hybrid silicon wafer; and
    fine crystals having an average crystal grain size of 8 mm or less at the polycrystalline silicon portion within 10 mm from a boundary with the single-crystal silicon portion.

2. The hybrid silicon wafer according to claim 1, wherein the relative intensity based on X-ray diffraction of a (400) orientation of the polycrystalline silicon portion within 10 mm from the boundary with the single-crystal silicon portion is 5 or more when the intensity of a (511) orientation is 100.

3. The hybrid silicon wafer according to claim 2, wherein a the plate-shaped single-crystal silicon portion is located at a center of the hybrid silicon wafer or is decentered relative to the center of the hybrid silicon wafer.

4. The hybrid silicon wafer according to claim 3, wherein the wafer is disk-shaped, and the overall diameter of the wafer is 400 mm or more.

5. The hybrid silicon wafer according to claim 2, wherein a relative intensity based on X-ray diffraction of a (400) orientation of the polycrystalline silicon portion distanced 50 mm or more from the boundary with the single-crystal silicon portion when the intensity of a (511) orientation is 100 is less than the relative intensity based on X-ray diffraction of a (400) orientation of the polycrystalline silicon portion within 10 mm from the boundary with the single-crystal silicon portion when the intensity of a (511) orientation is 100.

6. The hybrid silicon wafer according to claim 2, wherein a relative intensity based on X-ray diffraction of a (400) orientation of the polycrystalline silicon portion distanced 50 mm or more from the boundary with the single-crystal silicon portion is 1 to 2 when the intensity of a (511) orientation is 100.

7. The hybrid silicon wafer according to claim 1, wherein the plate-shaped single-crystal silicon portion is located at a center of the hybrid silicon wafer or is decentered relative to the center of the hybrid silicon wafer.

8. The hybrid silicon wafer according to claim 1, wherein the wafer is disk-shaped, and the overall diameter of the wafer is 400 mm or more.

9. The hybrid silicon wafer according to claim 1, wherein a relative intensity based on X-ray diffraction of a (400) orientation of the polycrystalline silicon portion distanced 50 mm or more from the boundary with the single-crystal silicon portion is 1 to 2 when the intensity of a (511) orientation is 100.

10. A method of manufacturing the hybrid silicon wafer of claim 1, wherein a columnar single-crystal silicon ingot is set in a mold in advance, molten silicon is cast around and integrated with the single-crystal ingot to prepare an ingot complex of single-crystal silicon and polycrystalline silicon, and a wafer shape is cut out therefrom to form a structure in which a plate-shaped single-crystal silicon portion has an outer peripheral edge and in which a polycrystalline silicon portion extends coplanar with the single-crystal silicon portion and laterally from the outer peripheral edge of the single-crystal silicon portion such that the polycrystalline silicon portion forms an outer peripheral edge of the hybrid silicon wafer, the structure having fine crystals with an average crystal grain size of 8 mm or less at the polycrystalline silicon portion within 10 mm from a boundary with the single-crystal silicon portion.

11. The method of manufacturing a hybrid silicon wafer according to claim 10, wherein the mold is preheated to 800 to 1300° C.

12. The method of manufacturing a hybrid silicon wafer according to claim 10, wherein a crucible for melting polycrystalline silicon is a crucible comprised primarily of SiO2, a carbon sleeve is disposed around the crucible, temperature of carbon is raised based on high frequency induction heating, and silicon is heated and melted indirectly based on the heat transfer thereof.

* * * * *